United States Patent
Eckert et al.

(10) Patent No.: US 11,765,849 B2
(45) Date of Patent: Sep. 19, 2023

(54) DAUGHTER CARD PLUG DETECTION

(71) Applicant: INTERNATIONAL BUSINESS MACHINES CORPORATION, Armonk, NY (US)

(72) Inventors: Stanley Eckert, Poughkeepsie, NY (US); Steven Louis Makow, Poughkeepsie, NY (US); Todd Edward Takken, Brewster, NY (US)

(*) Notice: Subject to any disclaimer, the term of this patent is extended or adjusted under 35 U.S.C. 154(b) by 53 days.

(21) Appl. No.: 17/651,275

(22) Filed: Feb. 16, 2022

(65) Prior Publication Data

US 2023/0262919 A1 Aug. 17, 2023

(51) Int. Cl.
*H05K 7/14* (2006.01)
*G06F 13/40* (2006.01)

(52) U.S. Cl.
CPC ....... *H05K 7/1429* (2013.01); *G06F 13/4081* (2013.01); *H05K 7/1435* (2013.01)

(58) Field of Classification Search
CPC . G06F 13/4081; H05K 7/1429; H05K 7/1435
See application file for complete search history.

(56) References Cited

U.S. PATENT DOCUMENTS

| | | | |
|---|---|---|---|
| 5,612,634 A | 3/1997 | MacKenna | |
| 6,401,157 B1 | 6/2002 | Nguyen | |
| 7,523,241 B2 * | 4/2009 | Konishi | H04N 5/775 348/720 |
| 7,610,423 B2 | 10/2009 | Gower | |
| 8,390,344 B2 * | 3/2013 | McCorkle | H03B 19/00 327/119 |
| 8,862,792 B2 | 10/2014 | Hess | |
| 9,953,001 B2 | 4/2018 | Edirisooriya | |
| 10,317,459 B2 | 6/2019 | Chadha | |
| 10,545,773 B2 | 1/2020 | Raghav | |
| 10,552,253 B2 | 2/2020 | Iyer | |
| 11,003,610 B2 | 5/2021 | Wu | |
| 2015/0372767 A1 * | 12/2015 | Inoue | H04B 10/116 398/118 |

* cited by examiner

*Primary Examiner* — Brian T Misiura
(74) *Attorney, Agent, or Firm* — Douglas M. Crockatt

(57) ABSTRACT

A structure is provided for a structure for providing electrical connections across a connection interface is provided. The structure may include one or more signal connections, a plurality of reference connections, and one or more high-pass filters. One or more of the reference connections is configured to connect a first reference voltage in a first region on a first side of the interface with a second reference voltage in a second region on a second side of the interface. One or more of the reference connections in a first class of reference connections is coupled one or more of the reference voltages through the one or more high-pass filters, and low-bandwidth information is communicated across the one or more reference connections in the first class of reference connection.

20 Claims, 9 Drawing Sheets

DAUGHTER CARD PLUG DETECTION

FIELD

This disclosure relates generally to field of electronics, and more particularly to computer hardware.

BACKGROUND

On large server boards that contain many connectors, such as a 4 socket CPU motherboard with up to 64 DIMM connectors, it is beneficial to have daughter card plug detection verified after assembly, before the server is connected in a data center rack and running. In legacy servers, connectors would typically provide a separate plug detect signal which would be connected to GND inside the device that is plugged. A weak pullup resistor to voltage would be added on the main board to detect the case when no device is plugged, or a device is mis-plugged.

SUMMARY

Embodiments relate to structures for providing electrical connections across a connection interface. According to one aspect, a structure for providing electrical connections across a connection interface is provided. The structure may include one or more signal connections, a plurality of reference connections, and one or more high-pass filters. One or more of the reference connections is configured to connect a first reference voltage in a first region on a first side of the interface with a second reference voltage in a second region on a second side of the interface. One or more of the reference connections in a first class of reference connections is coupled one or more of the reference voltages through the one or more high-pass filters, and low-bandwidth information is communicated across the one or more reference connections in the first class of reference connection.

According to another aspect, a structure for providing electrical connections across a connection interface is provided. The structure may include one or more signal connections, a plurality of reference connections, and one or more high-pass filters. One or more of the reference connections is configured to connect a first reference voltage in a first region on a first side of the interface with a second reference voltage in a second region on a second side of the interface. One or more of the reference connections in a first class of reference connections is coupled to one or more reference voltages through the one or more high-pass filters. Low-bandwidth information is communicated across the one or more reference connections in the first class of reference connection. One or more reference connections in a second class of reference connection make a direct connection between a first reference voltage in the first region and a second reference voltage in the second region.

According to another aspect, a structure for providing electrical connections across a connection interface is provided. The structure may include one or more signal connections, a plurality of reference connections, and one or more high-pass filters. One or more of the reference connections is configured to connect a first reference voltage in a first region on a first side of the interface with a second reference voltage in a second region on a second side of the interface. One or more of the reference connections in a first class of reference connections is coupled one or more of the reference voltages through the one or more high-pass filters. Low-bandwidth information is communicated across the one or more reference connections in the first class of reference connection. An order of connections in the connection interface is configured to minimize a number of reference connections in the first class of reference connections located adjacent to one or more signal connections. The order of connections in the connection interface is configured to minimize a number of plug detect connections and maximize a number of reference connections of a second class of reference connections located adjacent to the signal connections. The structure may also include a plug detect connection located adjacent to at most one signal connection.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings.

DETAILED DESCRIPTION

Detailed embodiments of the claimed structures are disclosed herein; however, it can be understood that the disclosed embodiments are merely illustrative of the claimed structures that may be embodied in various forms. Those structures may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of electronics, and more particularly to computer hardware. The following described exemplary embodiments provide structures for electrical connections across a connection interface. As previously described, large server boards may contain many connectors, such as a 4 socket CPU motherboard with up to 64 DIMM connectors. Thus, it is beneficial to have daughter card plug detection verified after assembly, before the server is connected in a data center rack and running. In legacy servers, connectors would typically provide a separate plug detect signal which would be connected to GND inside the device that is plugged. A weak pullup resistor to voltage would be added on the main board to detect the case when no device is plugged, or a device is mis-plugged. Newer connector systems do not typically provide a separate plug detect signal and require the plugged devices to be powered on in the system before plug detection can occur. It may be advantageous, therefore, to perform plug detection without power applied to the connectors. This may be achieved through an interface using a low-power connection through existing ground pins that allows for detection of proper interconnection of the devices without the need to power up the devices fully.

Figure 1:
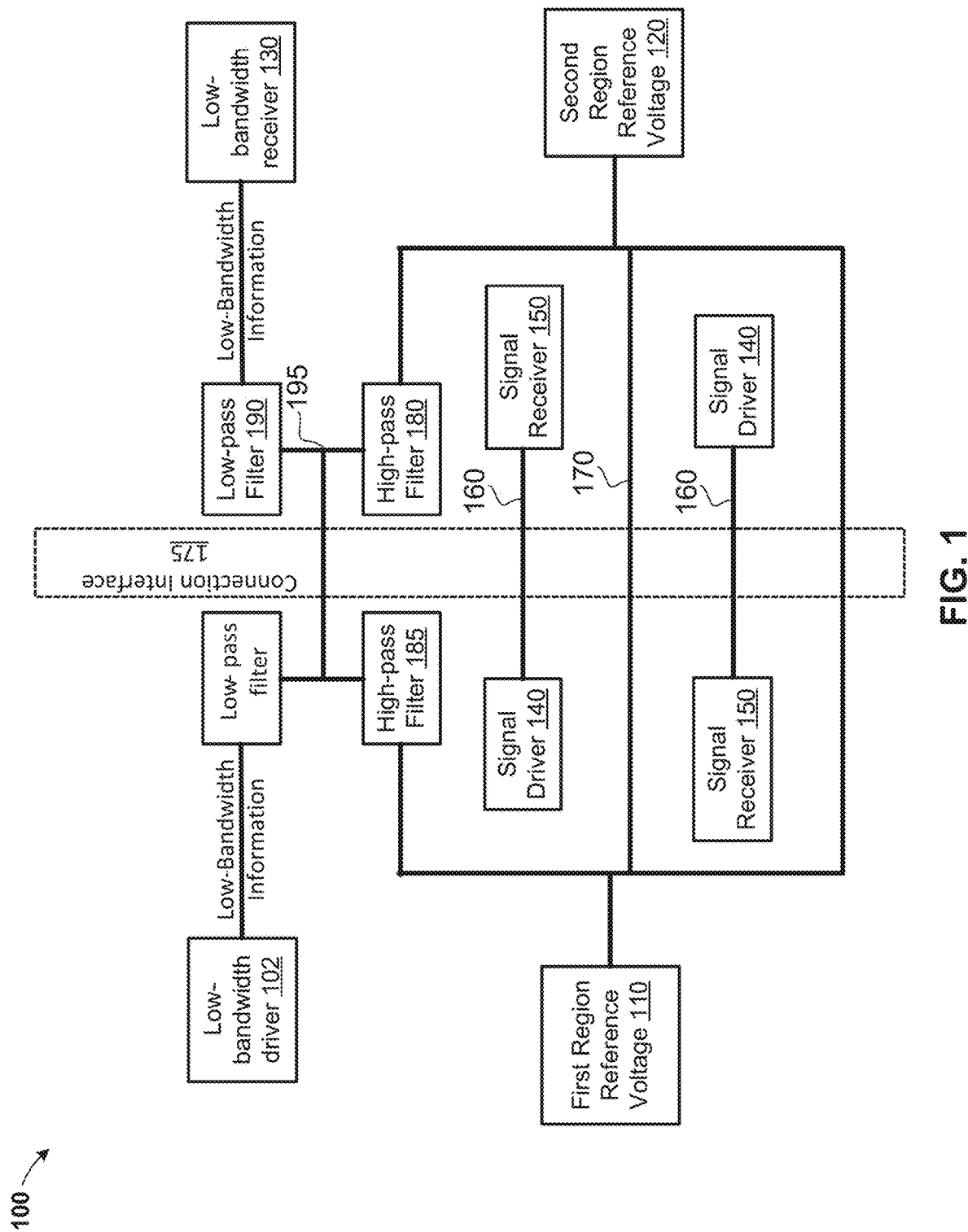
FIG. 1 is a diagram of an interface between two signaling regions, according to at least one embodiment.

Referring now to FIG. 1, a diagram 100 of an interface 175 between two signaling regions is depicted, according to at least one embodiment. The signaling regions may correspond to a source of low-bandwidth information and a receiver of low-bandwidth information for communicating the low-bandwidth information across the reference connections of the interface. The interface 175 may include signals and reference connections between two signaling regions where low-bandwidth signal information passes through a low-pass filter that is isolated from one or more reference connections passing through a high-pass filter at the interface connection.

The connection interface 175 may be used to transmit signals and reference connections between the first electrical signaling region and the second electrical signaling region. The signal drivers 140 transmit high-speed signals to the signal receivers 150 over connection 160. The corresponding reference voltage 110 in the first region is tied to the reference 120 in the second region through the reference connection 170. In parallel, a low bandwidth driver 102 sends a control signal to a low bandwidth receiver 130 through connection 195, which is a low bandwidth signal that has been converted from a reference connection by using a low-pass filter 190. The reference connection 195 is re-established by using high-pass filters 180 and 185 on both sides of the interface. The high-pass filter may include one or more capacitors coupled in series.

Figure 2:
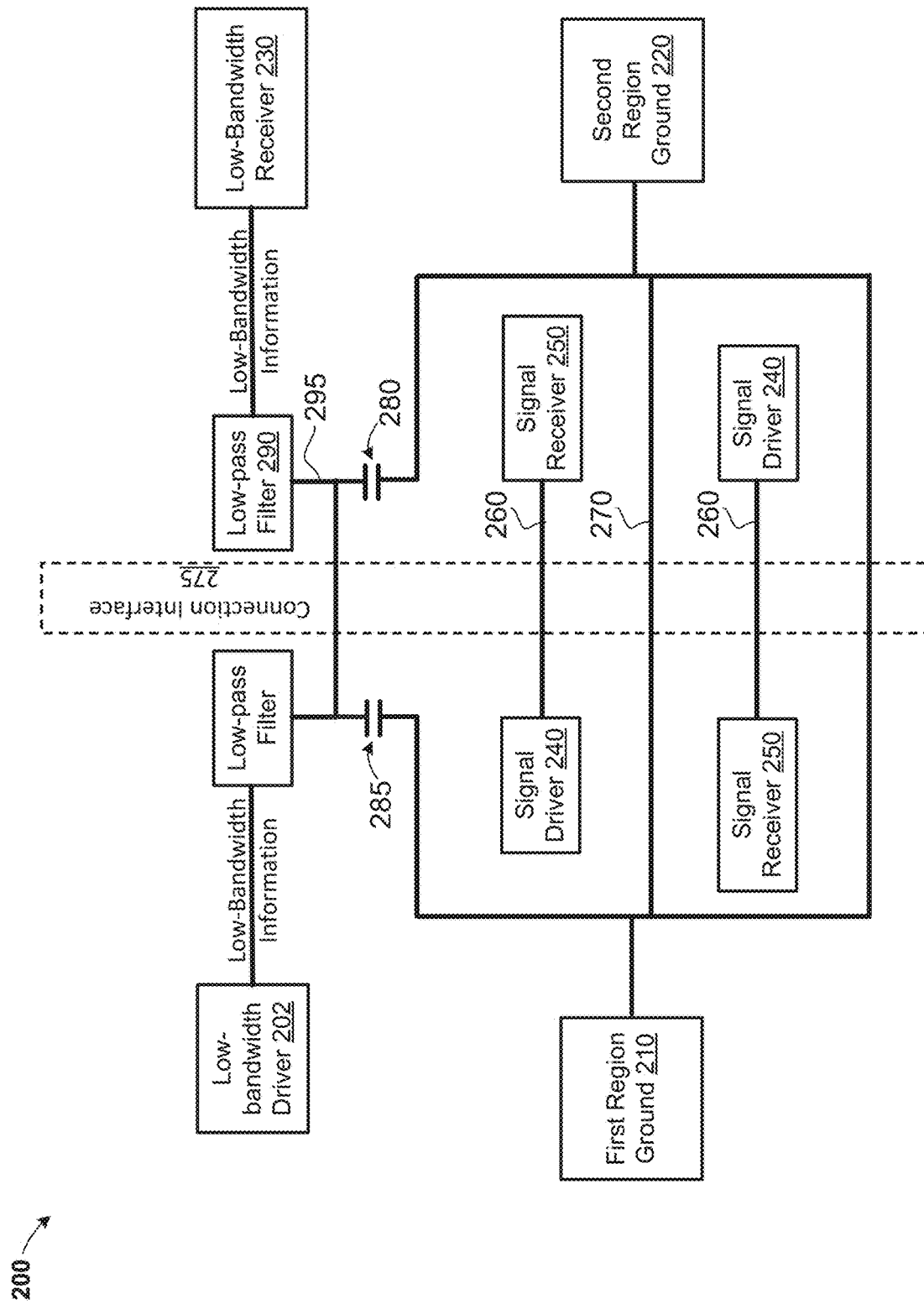
FIG. 2 is a diagram of an interface between two signaling regions, according to at least one embodiment.

Referring now to FIG. 2, a diagram 200 of an interface 275 between two signaling regions is depicted, according to at least one embodiment. The interface 275 may include signals and GND reference connections passing through the interface with low bandwidth signal information propagating through a low-pass filter that filters one or more GND reference connections with a capacitor from the low bandwidth signal to GND on both sides of the interface connection.

The diagram 200 depicts the connection interface 275 that is used to transmit signals and reference connections between the first electrical signaling region and the second electrical signaling region. The signal drivers 240 transmit high-speed signals to the signal receivers 250 over connections 260. The corresponding GND reference voltage 210 in the first region is tied to the reference 220 in the second region through the reference connection 270. In parallel, a low bandwidth driver 202 sends a control signal to a low bandwidth receiver 230 through connection 295, which is a signal that has been converted from a reference connection by using a low-pass filter 290. The reference connection 295 is re-established by using capacitors 280 and 285 to GND on both sides of the interface.

Figure 3:
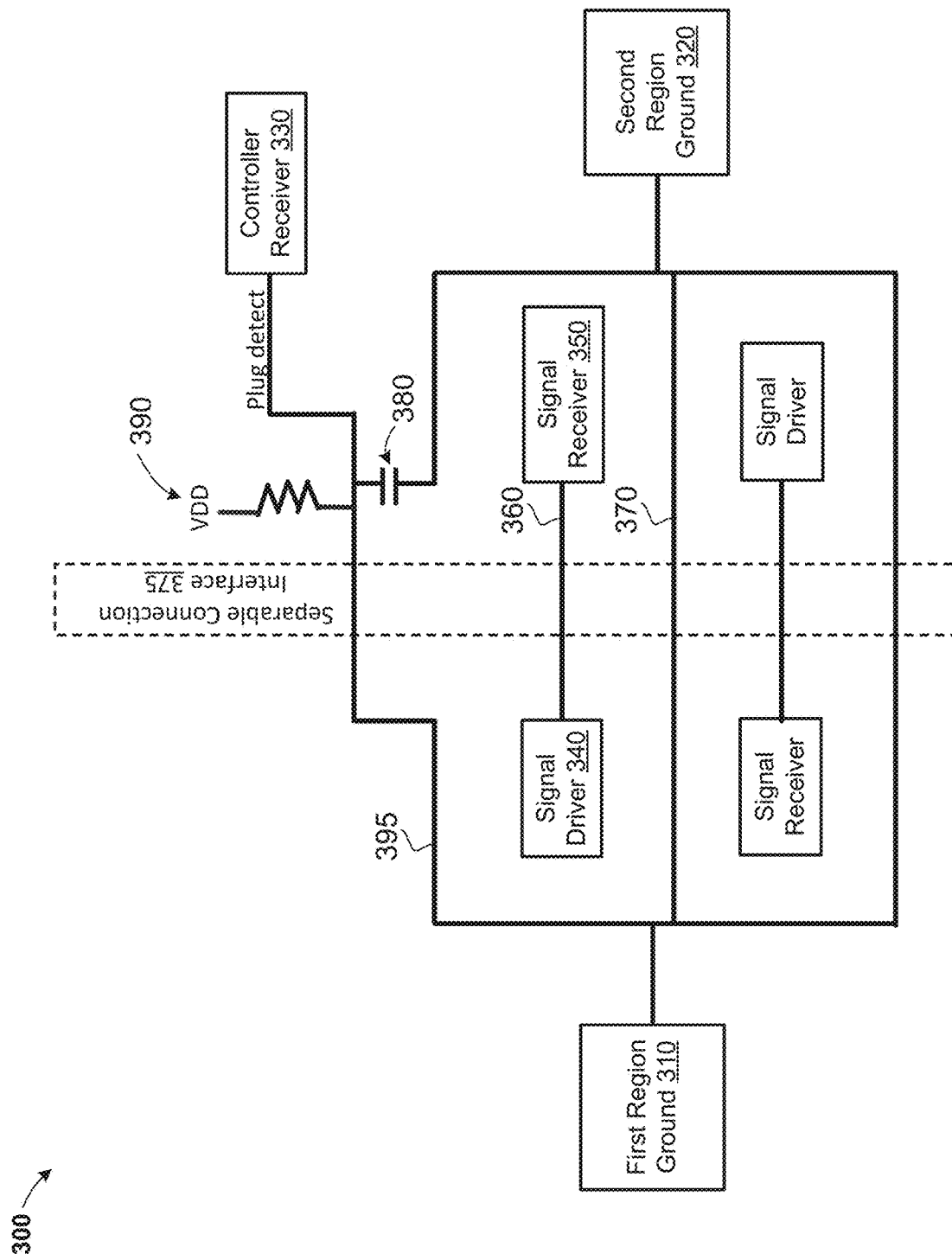
FIG. 3 is a diagram of an interface between two signaling regions, according to at least one embodiment.

Referring now to FIG. 3, a diagram 300 of an interface 375 between two signaling regions is depicted, according to at least one embodiment. The interface 375 may include signals and GND reference connections passing with a plug detect signal propagating through it that is tied to GND in the first electrical region and propagates to a receiver on a controller chip in the second electrical region. The plug detect signal is filtered with a capacitor to GND and a resistor pulled to a voltage in the second electrical region.

The diagram 300 depicts a separable connection interface 375 that is used to transmit signals and reference connections between the first electrical signaling region and the second electrical signaling region. The signal driver 340 transmits a high-speed signal to the signal receiver 350 through connection 360. The corresponding GND reference voltage 310 in the first region is tied to the reference 320 in the second region through the reference connection 370. In parallel, a controller receiver 330 receives a signal through connection 395, which is a signal that detects if a device is plugged in the first electrical region. Resistor 390 is added to pullup the signal to VDD when the first signal region is not present. The reference connection is re-established by using a capacitor 380 to GND in the second region. A pullup resistor coupled to a logically high voltage in the second region pulls a plug detect signal high in the second region based on the separable connection interface causing the one or more reference connections in the first class of reference connection to break contact with the first ground reference voltage.

One or more of the reference connections may be from a first class of reference connections that is coupled one or more of the reference voltages through the high-pass filters. One or more of the reference connections may be configured to connect a first reference voltage in a first region on a first side of the interface with a second reference voltage in a second region on a second side of the interface. One or more reference connections in a second class of reference connection may be configured to make a direct connection between a first reference voltage in the first region and a second reference voltage in the second region. One or more of the second class of reference connections may be configured to make a direct connection between a ground reference voltage in the first region and a ground reference voltage in the second region. One or more of the capacitors connecting the one or more reference connections of the first class may be located in close proximity to the reference connection and to a nearest signal connection.

A location associated with the capacitors may be configured to provide a low inductance current loop between the reference connection and the ground reference voltage in the circuit board on which the capacitor or capacitors are located. Vias coupled to the reference connections and to the capacitors may be configured to minimize an inductive current loop between the reference connection and the ground reference voltages in the circuit boards. An order of connections in the connection interface may be configured to minimize a number of reference connections in the first class of reference connections located adjacent to signal connections. Additionally, the connection interface may also be configured to minimize the number of plug detect connections and maximize the number of reference connections located adjacent to signal connections.

Figure 4:
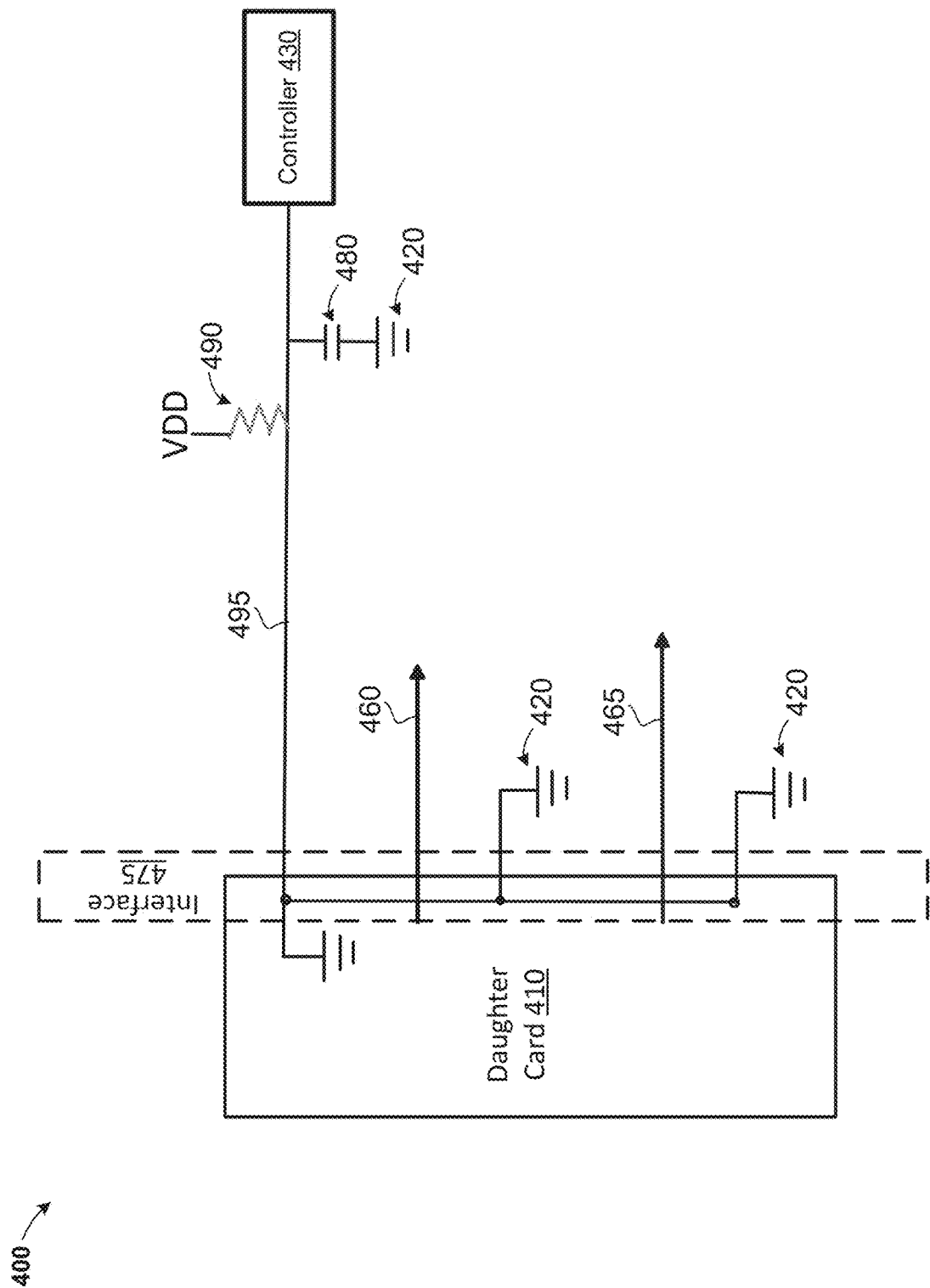
FIG. 4 is a diagram of a daughter card, according to at least one embodiment.

Referring now to FIG. 4, a diagram of a daughter card interface 475 is depicted, according to at least one embodiment. The daughter card interface 475 may include a connector that has data signals passing through it. Specifically, the daughter card interface may include, among other things, a daughter card 410, ground (GND) vias 420, a controller 430, data signal lines 460 and 465, a capacitor 480, a resistor 490, and a connection 495. One of the GND reference pins is converted to a plug detect signal that is monitored by a controller on the main board. The GND vias provide a high frequency return path for the data signals through the connector interface.

The diagram 400 of the daughter card interface 475 may depict how the plug detect function is logically implemented in the system. The data signal lines 460 and 465 propagate from the daughter card to the board through the connection interface. The adjacent GND vias 420 may be on the board side of the connector. A plug detect signal on the connection 495 is converted from an existing GND pin inside the daughter card 410 and routed through to the board as a signal wire. The capacitor 480 is a small cap that filters out high frequency noise and provides a return path back to GND. The resistor 490 pulls up the signal to VDD, so the plug detect will be high when the daughter card is not used or mis-plugged. A management controller 430 monitors a state of the plug detect signal on the connection 495 to determine which daughter cards are plugged.

To provide the capability to perform plug detection without power applied to the connectors, a GND pin from the daughter card connector is disconnected from the board GND plane and routed back to the management controller directly or through a port expander. However, connector GND pins also provide a high frequency return path for high-speed data signals between the main board and the daughter card.

For most newer connector standards, there is no separate plug detect pin identified. By only powering the management controller, the plug detection can be done without having to provide the higher power needed for all the daughter card connectors on the board. This enables detection at assembly through a low power connection into the system, such as a USB port. Any issues that are discovered can be corrected before the system is shipped to a data center.

Figure 5:
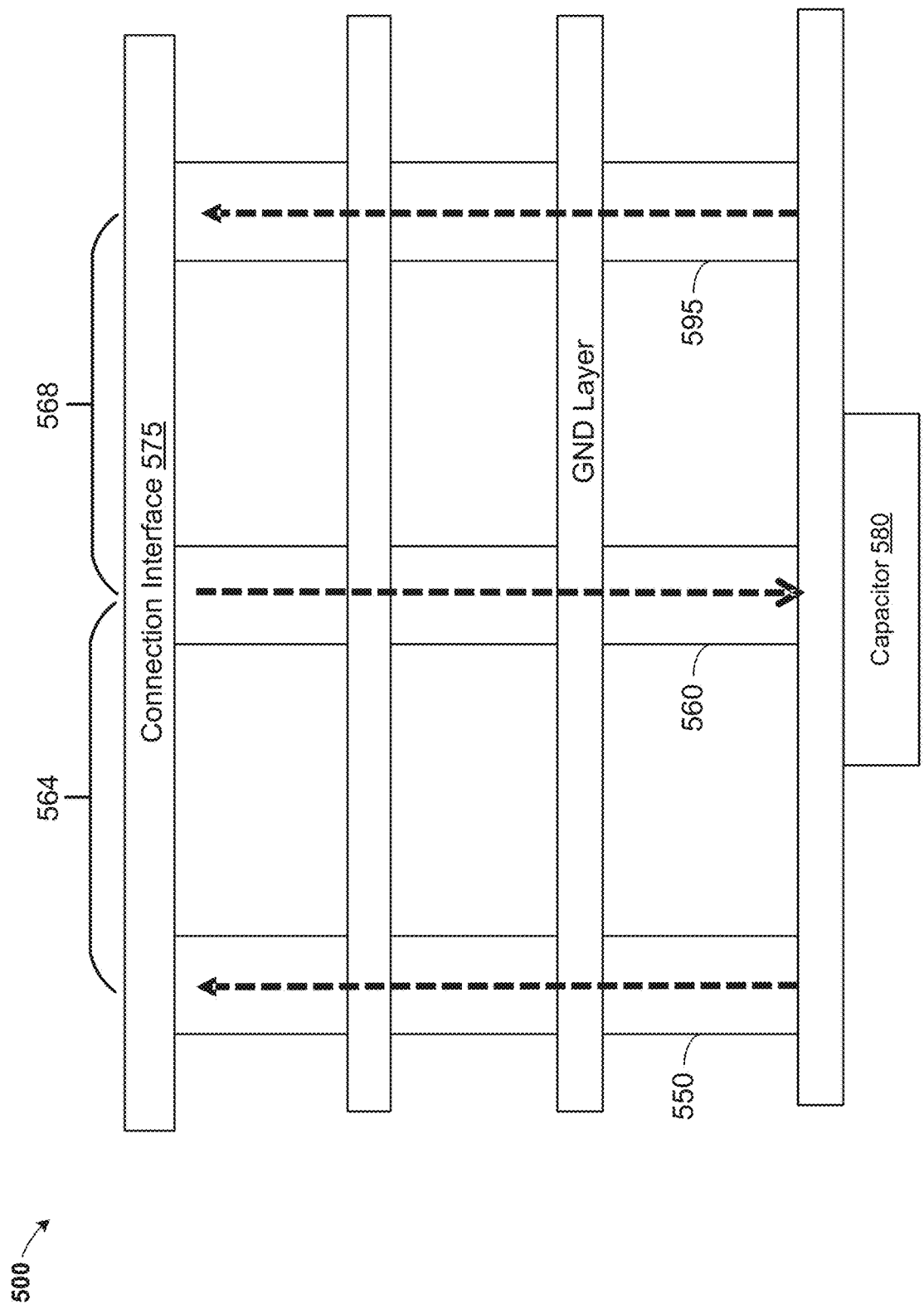
FIG. 5 is a diagram of a signal return path, according to at least one embodiment.

To minimize the impact on receiver margin, a GND pin that has the least impact on adjacent data signals near the edge of the connector is selected as the plug detect signal. As a result, the last GND pin at the edge of a standard daughter card connector is isolated to provide a plug detect signal through the connector. The only signal impacted by this change is a single data bit on the adjacent pin. While this signal will not have a GND return path back through the last pin, there is still a good high frequency return path through the adjacent pin which is still GND. Also, since the data line is not adjacent to other high-speed signals, the coupling is less than crosstalk on other data signals in the connector Referring now to FIG. 5, a diagram of a signal return path 500 is depicted, according to at least one embodiment. The signal return path 500 may be a data signal through multiple layers in the main board with one GND via defined as a plug detect signal. A small capacitor is shown from the plug detect to GND to improve the return path from the data signal back to GND. For example, to minimize the impact to timing and voltage margin when running at worst case conditions with 2 DIMMS per channel, a small 0.01 uF capacitor is placed near the connector pins which provides a HF return path back to GND.

The signal return path 500 is a cross section that shows how the data signal 560 flows through the layers in the board from the daughter card through the connection interface 575 and the corresponding return path on the plug detect 595 through 568 and the connector GND via 550 through 564. Adding a capacitor 580 on the plug detect signal to GND lowers the impedance of the signal return path back to GND.

Figure 6:
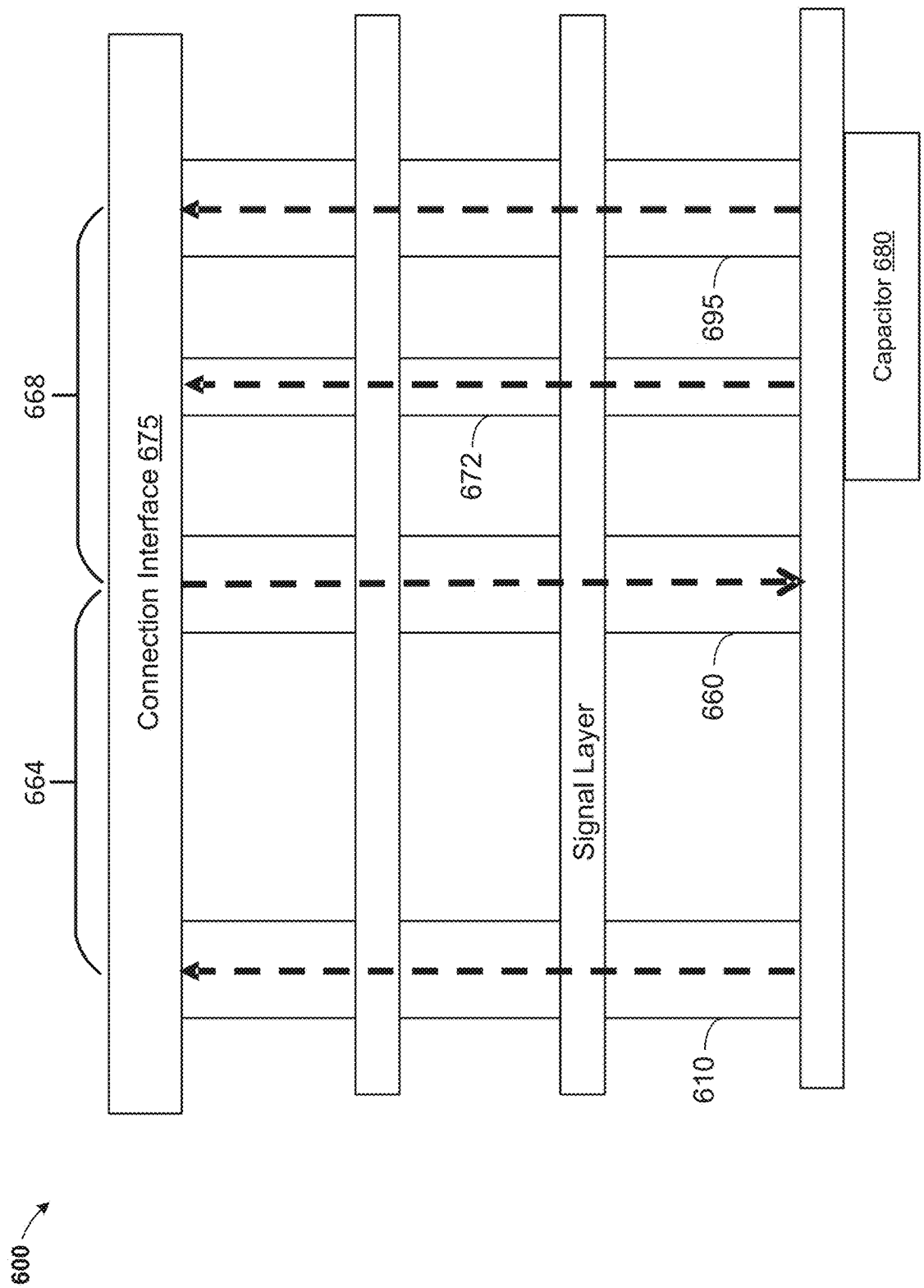
FIG. 6 is a diagram of a signal return path, according to at least one embodiment.

Referring now to FIG. 6, a diagram of a signal return path 600 is depicted, according to at least one embodiment. The signal return path 600 may be a data line through different layers in the board with an additional GND via added to the board near the data signal. A small capacitor is added from the plug detect signal to the extra GND via to lower the impedance of the return path beyond just having the capacitor alone.

The signal return path 600 is a cross section that shows how the data signal 660 flows through the layers in the board from the daughter card through the connection interface 675 and the corresponding return path on the plug detect 695 through 668 and the connector GND via 650 through 664. Adding both a capacitor 680 near the plug detect signal and an additional GND via 672 near the data signal lowers the impedance of the signal return path back to GND since the extra via reduces the inductance over adding capacitor 680 only.

An additional GND via can be added to the capacitor that is close to the data signal via to improve the return path back to GND. A second capacitor to GND can also be added to the plug detect signal to improve the return path in the connector area where feasible. In addition, the signal is routed with good isolation from other nets to minimize signal crosstalk in the board. A weak 10 K-ohm pullup to the voltage at the management controller is used to pull the signal high when the daughter card is empty or not plugged correctly. This yields a time constant of ~100 us which is fast enough to determine which daughter cards are plugged by the management controller without loading down the signal. The timing and voltage margin can be verified using diagnostics in the system. The daughter card schematics show the location of the pins adjacent to the plug detect signal with the capacitor to GND and the pullup resistor.

Figure 7:
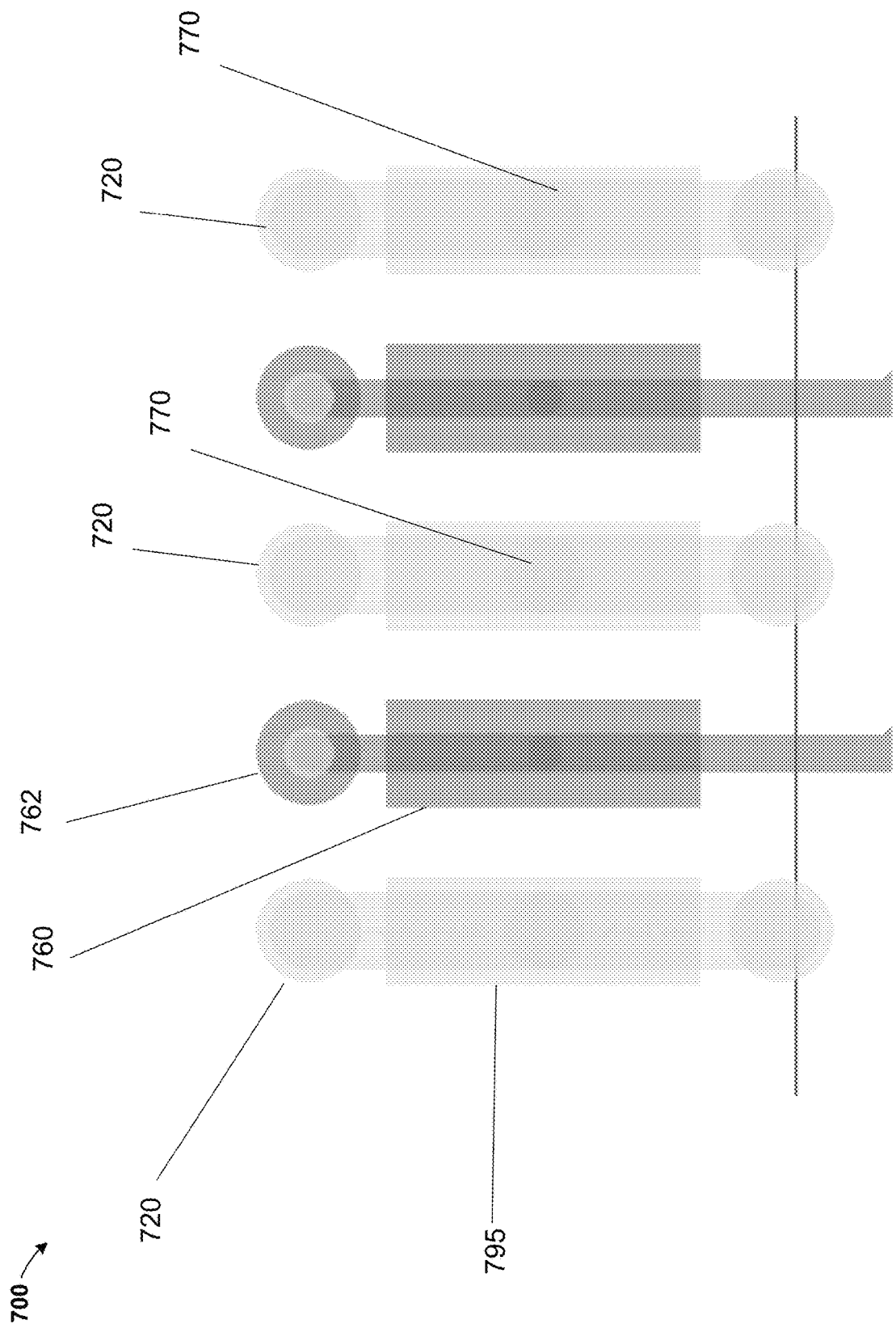
FIG. 7 is a diagram of a printed circuit board layout, according to at least one embodiment.

Referring now to FIG. 7, a diagram of a printed circuit board layout 700 is depicted, according to at least one embodiment. The printed circuit board layout 700 may correspond to a standard footprint for a row of the connector on the main board. Each data line is centered between two GND pads with two vias on each GND pad. The printed circuit board layout 700 may include, among other things, one or more vias 720 and 762 and one or more pads 760, 770, and 795.

The printed circuit board layout 700 is a representation of the top surface of a printed circuit board (PCB) depicting a top surface connector interface to a daughter card without plug detect implemented. The pad 760 is a surface pad soldered to a connector pin tied to a highspeed signal that travels across the PCB to/from the daughter card. The via 762 is a PCB via connected to the pad 760 by a top surface trace which connects to on an internal layer of the PCB with adjacent ground layers for return path. The pads 770 are surface pads soldered to one or more connector pins tied to ground on the daughter card. The vias 720 are PCB ground vias connected to the pads 770 and 795 by a top surface trace and tied to internal ground planes on the PCB. The pad 795 is the surface pad soldered to a connector pin tied to ground on the daughter card that will be rewired to use as a plug detect symbol.

Figure 8:
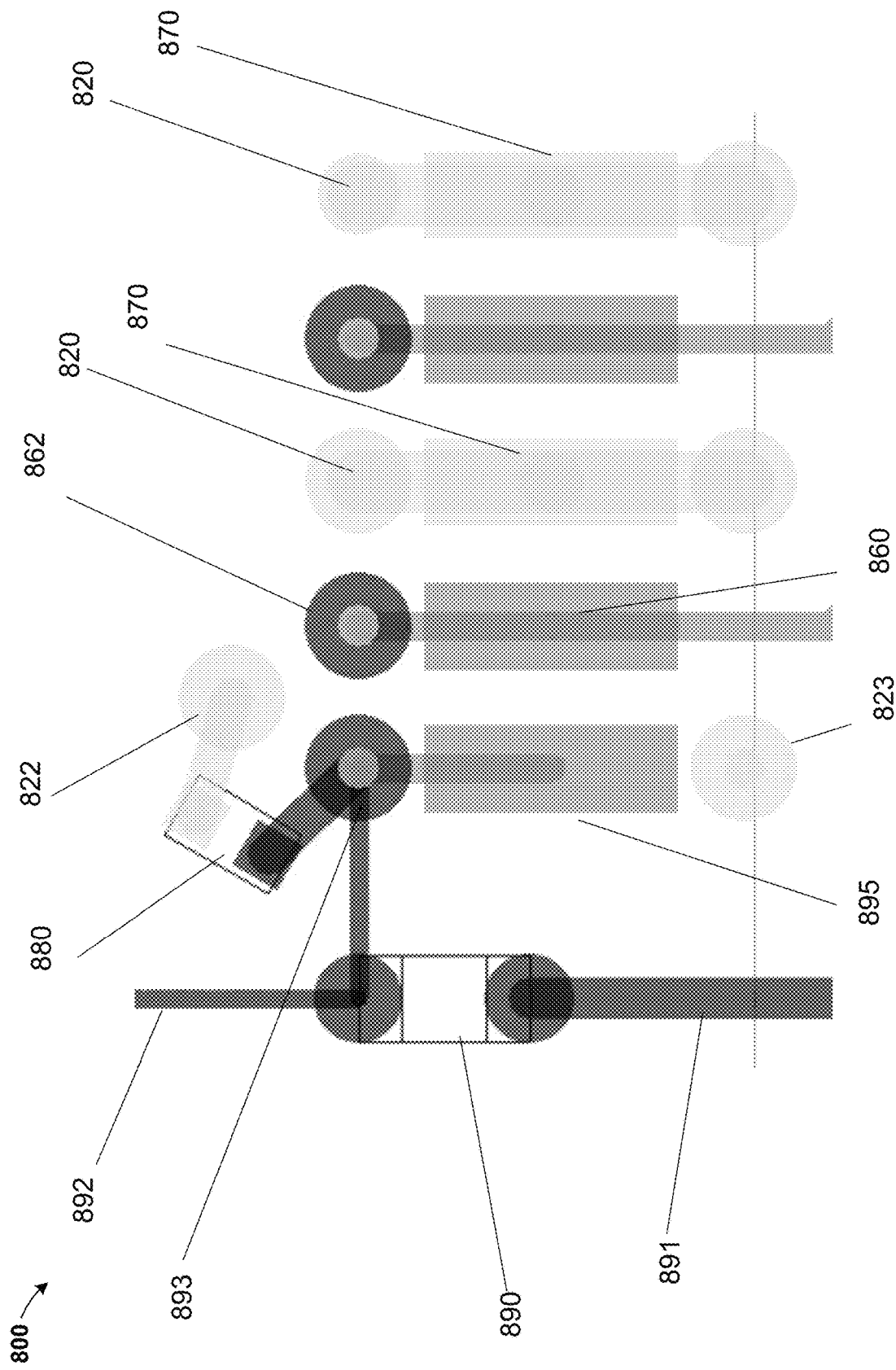
FIG. 8 is a diagram of a printed circuit board layout, according to at least one embodiment.

Referring now to FIG. 8, a diagram of a printed circuit board layout 800 is depicted, according to at least one embodiment. The layout may correspond to a standard footprint for a row of the connector on the main board with one of the GND pins converted to a plug detect signal. A capacitor is placed near the data signal and routed to the plug detect signal on the surface and to a GND via placed as close to the data signal as possible. The printed circuit board layout 800 may include, among other things, one or more vias 820, 822, 823, 862, and 893; one or more pads 860, 870, and 895; one or more components 880 and 890; and one or more traces 891 and 892.

The printed circuit board layout 800 is a representation of the top and bottom surfaces of a printed circuit board depicting a top surface connector interface to a daughter card with plug detect implemented utilizing a bottom surface-mounted capacitor and resistor. The pad 895 is a surface pad soldered to a connector pin tied to ground on the daughter card which has been chosen to act as the plug detect signal. The via 893 is the PCB via connected to the pad 895 by a top surface trace which connects the pad 895 to the components 880 and 890, which may be bottom surface-mounted components. The trace 892 is a bottom surface trace connecting the pad 895, and the components 880 and 890 to a controller. The pad 860 is a surface pad soldered to a connector pin tied to a highspeed signal that travels across the PCB to/from the daughter card. The via 862 is a PCB via connected to the pad 860 by a top surface trace which connects to on an internal layer of the PCB with adjacent ground layers for return path. The component 890 may be a bottom surface-mounted resistor tied to a voltage source by a bottom surface trace and to the plug detect signal through the trace 892. The trace 891 is a bottom surface trace from a voltage source to the component 890. The pads 870 are surface pads soldered to connector pins tied to ground on the daughter card. The vias 820 are PCB ground vias connected to the pad 860 by a top surface trace and tied to internal ground planes on the PCB. The via 822 is a PCB via connecting internal ground planes to the component 880, which may be bottom surface-mounted capacitor. The via 823 is an optional PCB ground via. The component 880 is a bottom surface capacitor between the chosen plug detect signal and PCB ground.

Figure 9:
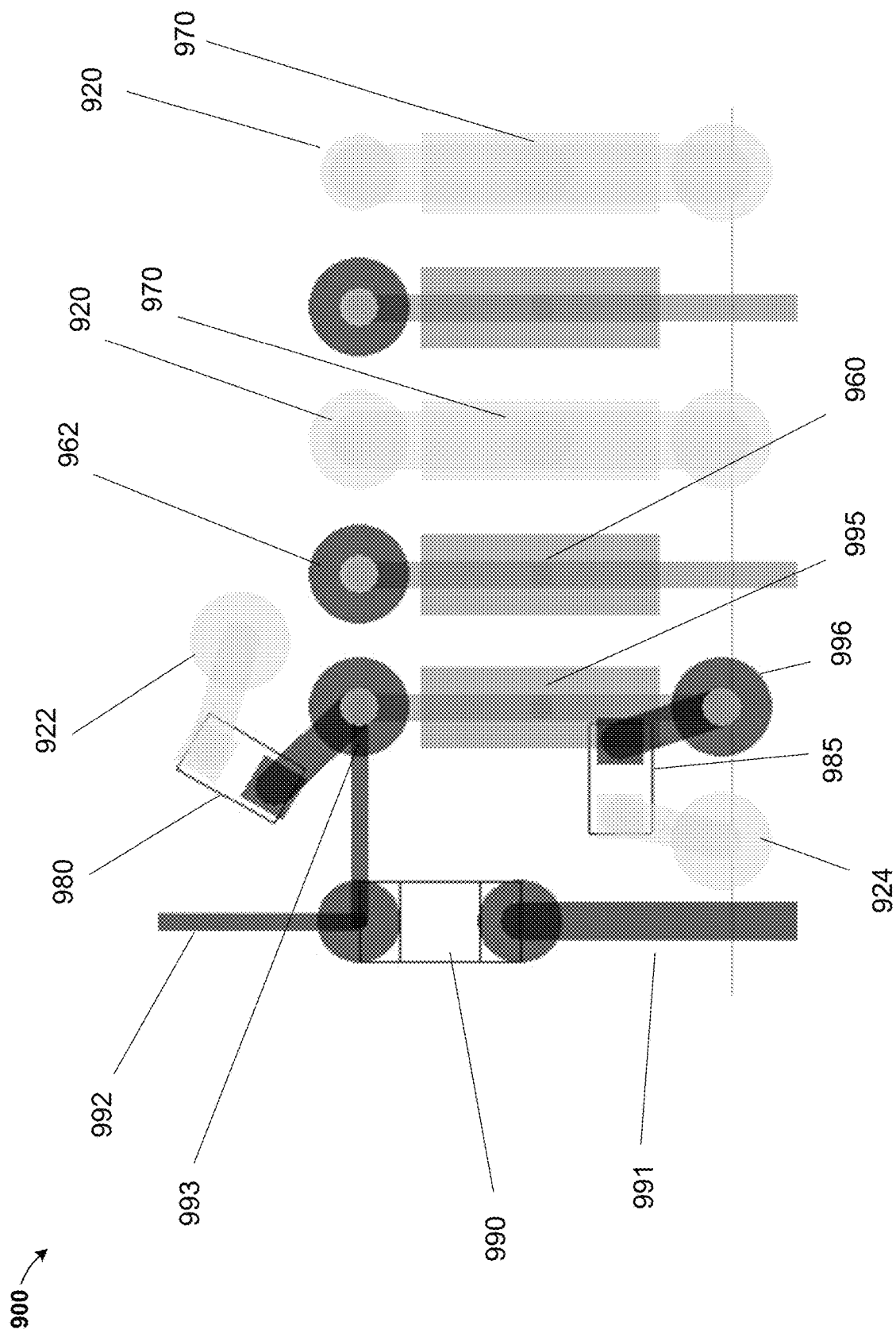
FIG. 9 is a diagram of a printed circuit board layout, according to at least one embodiment.

Referring now to FIG. 9, a diagram of a printed circuit board layout 900 is depicted, according to at least one embodiment. The layout may correspond to a footprint of the connector on the main board with one of the GND pins converted to a plug detect signal. One capacitor is placed near the data signal, and a second capacitor is placed on the other side of the signal pad to improve the return path back to GND. The printed circuit board layout may include, among other things, one or more vias 920, 922, 924, 962, 993, and 996; one or more traces 991 and 992; one or more contact pads 960, 970, and 995; and one or more components 980, 985, and 990.

The printed circuit board layout 900 is a representation of the top and bottom surfaces of a printed circuit board depicting a top surface connector interface to a daughter card with plug detect implemented utilizing a bottom surface-mounted capacitor and resistor with an additional bottom surface capacitor. The pad 995 is a surface pad soldered to a connector pin tied to ground on the daughter card which has been chosen to act as the plug detect signal. The via 993 is a PCB via connected to the pad 995 by a top surface trace which connects the pad 995 to the components 980 and 990, which may be bottom surface-mounted components. The trace 992 is a bottom surface trace connecting the pad 995, the component 980, and the component 990 to a controller. The pad 960 is a surface pad soldered to a connector pin tied to a highspeed signal that travels across the PCB to/from the daughter card. The via 962 is a PCB via connected to the pad 960 by a top surface trace which connects to on an internal layer of the PCB with adjacent ground layers for return path. The component 990 may be a bottom surface-mounted resistor tied to a voltage source by a bottom surface trace and to the plug detect signal through surface trace and the via 993. The trace 991 is a surface trace from a voltage source to the component 990. The pads 970 are surface pads soldered to connector pins tied to ground on the daughter card. The vias 920 are PCB ground vias connected to the pad 970 by a top surface trace and tied to internal ground planes on the PCB. The via 922 is a PCB via connecting internal ground planes to the component 980, which may be a bottom surface-mounted capacitor. The component 980 is a bottom surface capacitor between the chosen plug detect signal and PCB ground. The component 985 is an additional bottom surface capacitor between the chosen plug detect signal and PCB ground. Due to space considerations on the printed circuit board, it may be appreciated that one or more of the capacitors may be located on opposite surfaces of the printed circuit boards relative to the surfaces where the connection interface is located. The via 996 is the PCB via connecting the pad 995 with the component 985. The via 924 is a PCB via connecting the additional bottom surface capacitor to the internal ground layers.

Thus, the resulting structure described herein provides an interface for electrical connections between two separate printed circuit board devices. The structure described herein allows for detection of proper interconnection between two devices based on using only a low-power connection without the need to power up the devices fully.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for providing electrical connections across a connection interface, wherein the interface comprises:
   one or more signal connections;
   a plurality of reference connections,
      wherein one or more of the reference connections is
         configured to connect a first reference voltage in a first region on a first side of the interface with a second reference voltage in a second region on a second side of the interface; and one or more high-pass filters, wherein one or more of the reference connections in a first class of reference connections is coupled to one or more of the reference voltages through the one or more high-pass filters, wherein low-bandwidth information is communicated across the one or more reference connections in the first class of reference connection, and wherein the one or more reference connections in the first class of reference connections is isolated from a receiver of the low-bandwidth information through a low-pass filter.

2. The structure of claim 1, wherein the one or more high-pass filters provide low-frequency electrical isolation of the one or more reference connections in the first class of reference connections from the one or more reference voltages.

3. The structure of claim 1, wherein the one or more reference connections in the first class of reference connections is isolated from a source of low-bandwidth information through a low-pass filter.

4. A structure for providing electrical connections across a connection interface, wherein the interface comprises:

one or more signal connections;

a plurality of reference connections, wherein one or more of the reference connections is configured to connect a first reference voltage in a first region on a first side of the interface with a second reference voltage in a second region on a second side of the interface; and one or more high-pass filters, wherein one or more of the reference connections in a first class of reference connections is coupled to one or more reference voltages through the one or more high-pass filters, wherein low-bandwidth information is communicated across the one or more reference connections in the first class of reference connection, and wherein one or more reference connections in a second class of reference connections make a direct connection between a first reference voltage in the first region and a second reference voltage in the second region.

5. The structure of claim 4, wherein one or more of the second class of reference connections makes a direct connection between a first ground reference voltage in the first region and a second ground reference voltage in the second region.

6. The structure of claim 5, wherein one or more of the first class of reference connections is coupled to the first ground reference voltage and the second ground reference voltage through high-pass filters.

7. The structure of claim 6, wherein the high-pass filters comprises one or more capacitors connected in series.

8. The structure of claim 7, wherein the connection interface is separable.

9. The structure of claim 8, wherein a source of the low-bandwidth information is connected to one or more of the reference connections in the first class of reference connections in the first region comprises a direct connection to the first ground reference voltage.

10. The structure of claim 9, wherein a connection between the first ground reference voltage and the one or more reference connections in the first class of reference connections is separable.

11. The structure of claim 10, wherein the one or more reference connections in the first class of reference connections is connected to a receiver in the second region on the second side of the interface.

12. The structure of claim 11, wherein a controller in the second region is configured to detect whether the one or more reference connections in the first class of reference connections is connected to the first ground reference voltage based on the one or more reference connections in the first class of reference connections being configured to detect a plug connection.

13. The structure of claim 12, wherein a pullup resistor coupled to a logically high voltage in the second region pulls a plug detect signal high in the second region based on the separable connection interface causing the one or more reference connections in the first class of reference connections to break contact with the first ground reference voltage.

14. The structure of claim 7, wherein the first and second regions of the interface comprise printed circuit boards.

15. The structure of claim 14, wherein the one or more capacitors connecting the one or more reference connections of the first class are located in close proximity to the reference connections and to a nearest signal connection.

16. The structure of claim 15, wherein a location associated with the capacitors is configured to provide a low inductance current loop between the reference connections and the first ground reference voltage in the circuit board on which the capacitor or capacitors are located.

17. The structure of claim 16, further comprising one or more vias configured to connect layers of the printed circuit boards.

18. The structure of claim 17, wherein vias coupled to the reference connections and to the capacitors are configured to minimize an inductive current loop between the reference connections and the ground reference voltages in the circuit boards.

19. The structure of claim 18, wherein the one or more capacitors are located on opposite surfaces of the printed circuit boards relative to the surfaces where the connection interface is located.

20. A structure for providing electrical connections across a connection interface, wherein the interface comprises:

one or more signal connections;

a plurality of reference connections, wherein one or more of the reference connections is configured to connect a first reference voltage in a first region on a first side of the interface with a second reference voltage in a second region on a second side of the interface;

one or more high-pass filters, wherein one or more of the reference connections in a first class of reference connections is coupled to one or more of the reference voltages through the one or more high-pass filters, and wherein low-bandwidth information is communicated across the one or more reference connections in the first class of reference connections, wherein an order of connections in the connection interface is configured to minimize a number of reference connections in the first class of reference connections located adjacent to one or more signal connections, wherein the order of connections in the connection interface is configured to minimize a number of plug detect connections and maximize a number of reference connections of a second class of reference connections located adjacent to the signal connections; and a plug detect connection located adjacent to at most one signal connection.

* * * * *